US010134587B1

(12) United States Patent
Mizuguchi

(10) Patent No.: US 10,134,587 B1
(45) Date of Patent: Nov. 20, 2018

(54) METHOD OF MANUFACTURING SEMICONDUCTOR DEVICE

(71) Applicant: HITACHI KOKUSAI ELECTRIC INC., Tokyo (JP)

(72) Inventor: Yasuhiro Mizuguchi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 19 days.

(21) Appl. No.: 15/703,631

(22) Filed: Sep. 13, 2017

(30) Foreign Application Priority Data

Jul. 11, 2017 (JP) ................................ 2017-135413

(51) Int. Cl.
| | | |
|---|---|---|
| *H01L 21/67* | (2006.01) | |
| *H01L 21/02* | (2006.01) | |
| *C23C 16/455* | (2006.01) | |
| *C23C 16/458* | (2006.01) | |
| *C23C 16/46* | (2006.01) | |
| *C23C 16/52* | (2006.01) | |

(52) U.S. Cl.
CPC ...... *H01L 21/0228* (2013.01); *C23C 16/4586* (2013.01); *C23C 16/45565* (2013.01); *C23C 16/46* (2013.01); *C23C 16/52* (2013.01); *H01L 21/02617* (2013.01); *H01L 21/67276* (2013.01)

(58) Field of Classification Search
CPC ...... C23C 16/52; C23C 16/46; H01L 21/0228
USPC .............. 438/778, 758; 118/697; 156/345.24
See application file for complete search history.

(56) References Cited

U.S. PATENT DOCUMENTS

| | | | | |
|---|---|---|---|---|
| 2009/0112515 A1* | 4/2009 | Sugimoto | ......... | H01L 21/67253 702/179 |
| 2013/0102159 A1* | 4/2013 | Kotani | .............. | H01L 21/67276 438/758 |
| 2013/0178954 A1* | 7/2013 | Mizuguchi | ......... | G05B 23/0289 700/78 |
| 2013/0253689 A1* | 9/2013 | Yoneda | ................... | H01L 21/67 700/121 |
| 2014/0109833 A1* | 4/2014 | Ito | ..................... | H01L 21/67276 118/730 |
| 2014/0176701 A1* | 6/2014 | Okuno | .............. | H01L 21/67288 348/125 |
| 2014/0370628 A1* | 12/2014 | Sato | .................. | H01L 21/67167 438/16 |

(Continued)

FOREIGN PATENT DOCUMENTS

| JP | 2001-250780 A | 9/2001 |
|---|---|---|
| JP | 2014-086545 A | 5/2014 |

(Continued)

*Primary Examiner* — Jonathan Han
(74) *Attorney, Agent, or Firm* — Volpe and Koenig, P.C.

(57) ABSTRACT

There is provided a method of manufacturing a semiconductor device, including: transferring a substrate to a module having a first process chamber and a second process chamber; reading a recipe program depending on a type and a number of the substrate; and processing the substrate according to the recipe program, wherein in the act of processing the substrate, a first data indicating a state of the first process chamber and a second data indicating a state of the second process chamber are respectively detected, and a comparison between the first data and a previously-acquired first reference data and a comparison between the second data and a previously-acquired second reference data are displayed on a display screen.

18 Claims, 13 Drawing Sheets

(56) References Cited

U.S. PATENT DOCUMENTS

2015/0332912 A1    11/2015  Nowak et al.
2015/0371883 A1*  12/2015  Takahashi ......... H01L 21/67259
                                                                            438/5
2016/0056032 A1     2/2016  Baldasseroni et al.

FOREIGN PATENT DOCUMENTS

JP        2015-220458 A    12/2015
JP        2016-046524 A     4/2016

\* cited by examiner

FIG. 13

※ Presence ⊖, Absence ○    ※※ Presence ◆, Absence ◇

200a

| Number of sheets of PW | Presence or absence of DW | Presence or absence of gap of data |
|---|---|---|
| 1 sheet | ⊖ | ◆ |
|  | ○ | ◆ |
| 2 sheets | ⊖ | ◆ |
|  | ○ | ◇ |
| 3 sheets | ⊖ | ◇ |
|  | ○ | ◇ |
| 4 sheets | ⊖ | ◇ |
|  | ○ | ◇ |

200b

| Number of sheets of PW | Presence or absence of DW | Presence or absence of gap of data |
|---|---|---|
| 1 sheet | ⊖ | ◇ |
|  | ○ | ◇ |
| 2 sheets | ⊖ | ◇ |
|  | ○ | ◇ |
| 3 sheets | ⊖ | ◆ |
|  | ○ | ◇ |
| 4 sheets | ⊖ | ◇ |
|  | ○ | ◇ |

METHOD OF MANUFACTURING SEMICONDUCTOR DEVICE

CROSS-REFERENCE TO RELATED APPLICATION

This application is based upon and claims the benefit of priority from Japanese Patent Application No. 2017-135413, filed on Jul. 11, 2017, the entire contents of which are incorporated herein by reference.

TECHNICAL FIELD

The present disclosure relates to a method of manufacturing a semiconductor device.

BACKGROUND

In order to enhance the production efficiency, there is a type of substrate processing apparatus that collectively processes a plurality of substrates. For example, in this type of substrate processing apparatus, the plurality of substrates is circumferentially arranged in a single process chamber.

In this case, the substrates are processed by supplying a gas to the process chamber to form a film on each of the substrates. When processing the substrates, the gas is supplied under preset conditions.

In the substrate processing apparatus, it is required to improve yield. Thus, each of the substrates is processed to maintain a constant quality in the plane of the substrates. Furthermore, each of the substrates is processed to maintain a constant quality with high reproducibility.

In order to maintain this constant quality, it is desirable to set the state of the process chamber in which the substrates are processed to fall within a predetermined range. To do so, it is required to more accurately recognize the state of the process chamber.

SUMMARY

Some embodiments of the present disclosure provide a technique capable of easily recognizing a state of a process chamber.

According to one embodiment of the present disclosure, there is provided a method of manufacturing a semiconductor device, including: transferring a substrate to a module having a first process chamber and a second process chamber; reading a recipe program depending on a type and a number of the substrate; and processing the substrate according to the recipe program, wherein in the act of processing the substrate, a first data indicating a state of the first process chamber and a second data indicating a state of the second process chamber are respectively detected, and a comparison between the first data and a previously-acquired first reference data and a comparison between the second data and a previously-acquired second reference data are displayed on a display screen.

BRIEF DESCRIPTION OF THE DRAWINGS

FIG. 13 is an explanatory view illustrating a table according to the present embodiment.

DETAILED DESCRIPTION (1) Configuration of the Substrate Processing Apparatus

Figure 1:
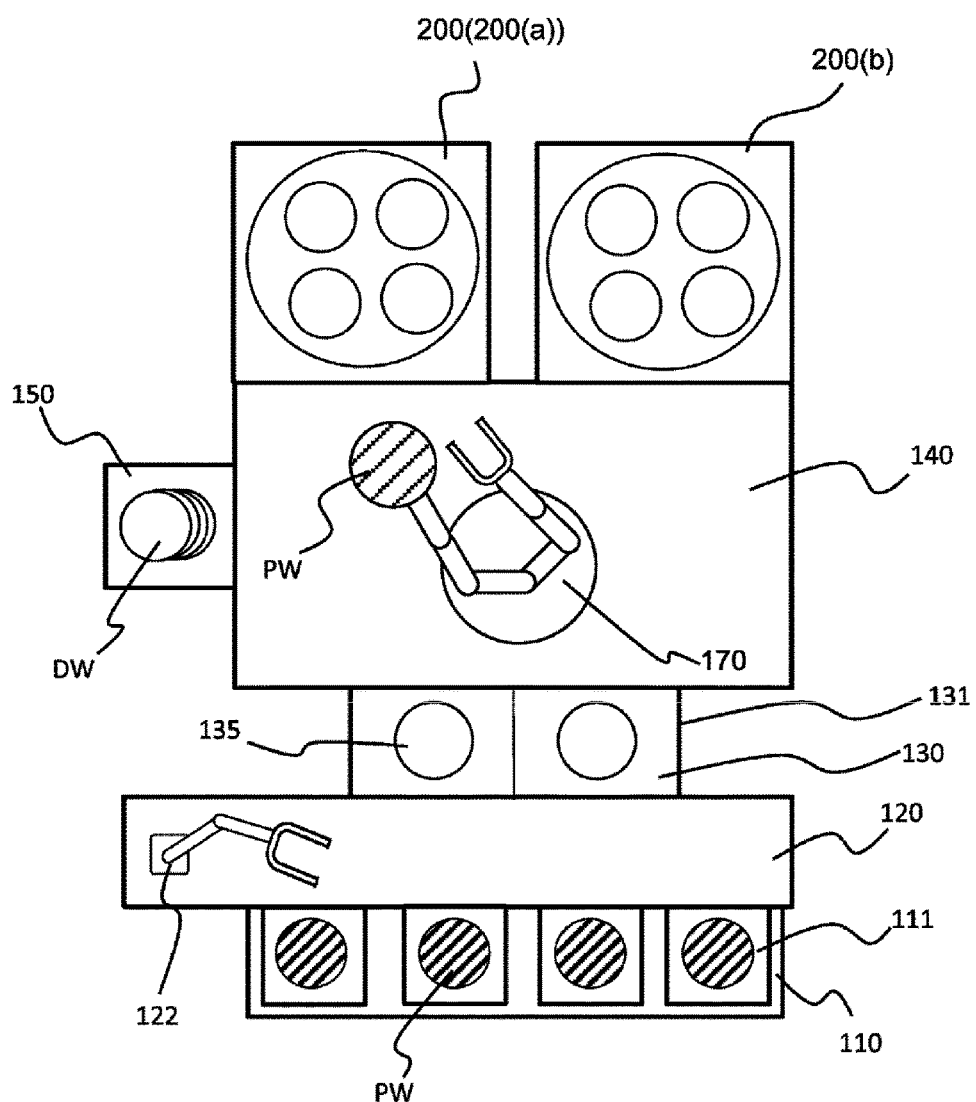
FIG. 1 is an explanatory view illustrating a substrate processing apparatus according to an embodiment of the present disclosure.
Figure 2:
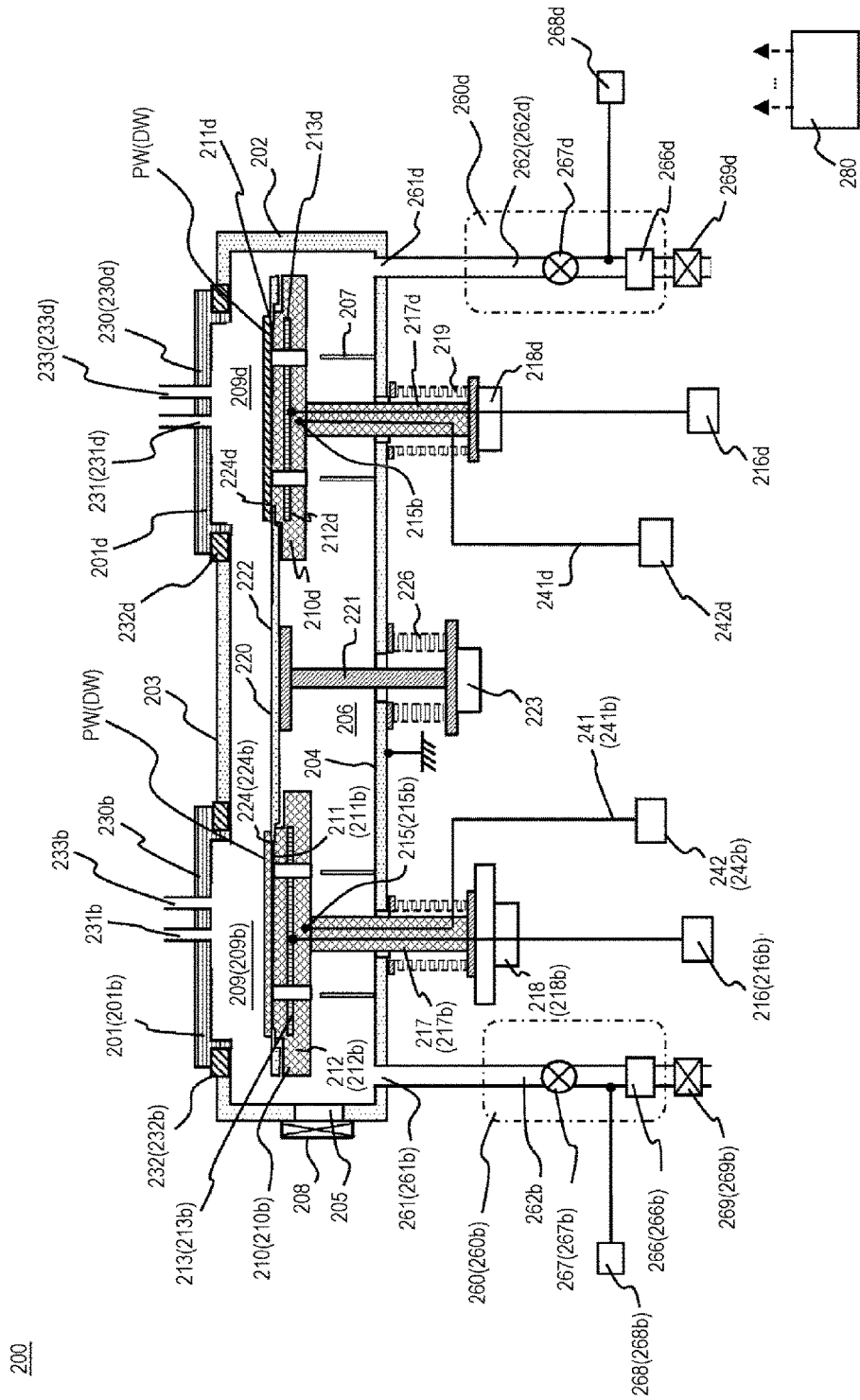
FIG. 2 is an explanatory view illustrating the substrate processing apparatus according to the present embodiment.
Figure 3:
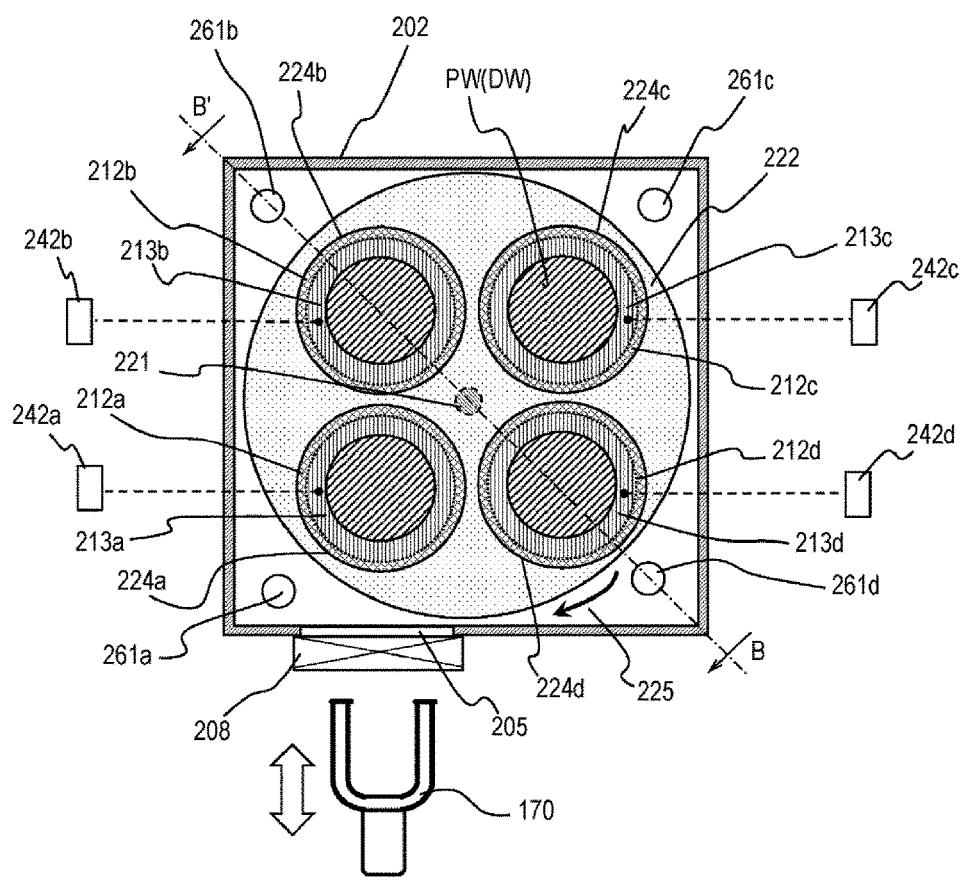
FIG. 3 is an explanatory view illustrating the substrate processing apparatus according to the present embodiment.
Figure 4:
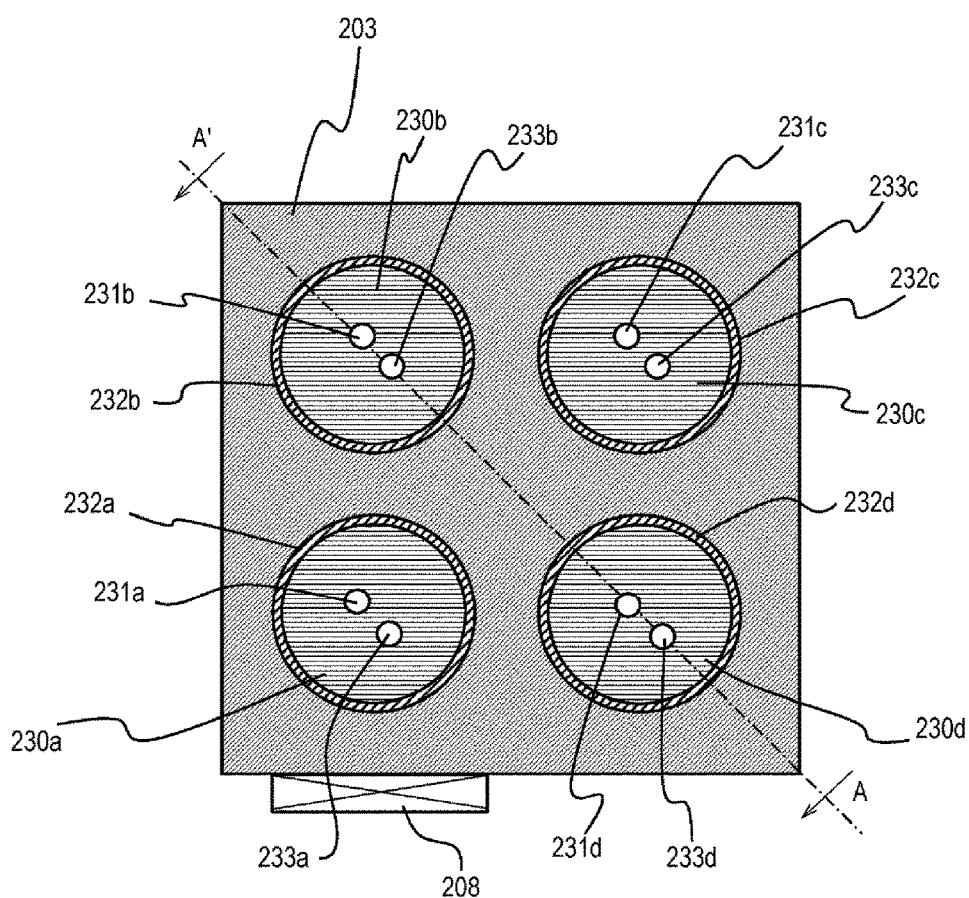
FIG. 4 is an explanatory view illustrating the substrate processing apparatus according to the present embodiment.
Figure 5:
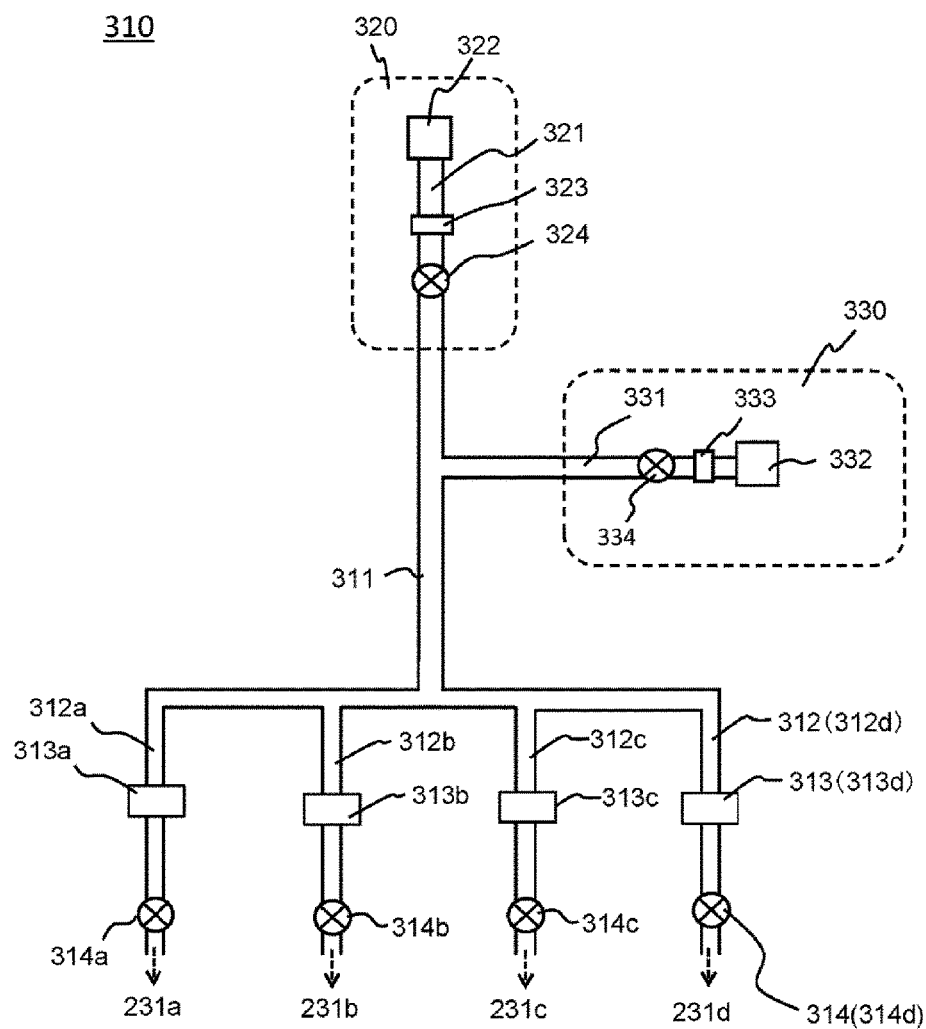
FIG. 5 is an explanatory view illustrating the substrate processing apparatus according to the present embodiment.
Figure 6:
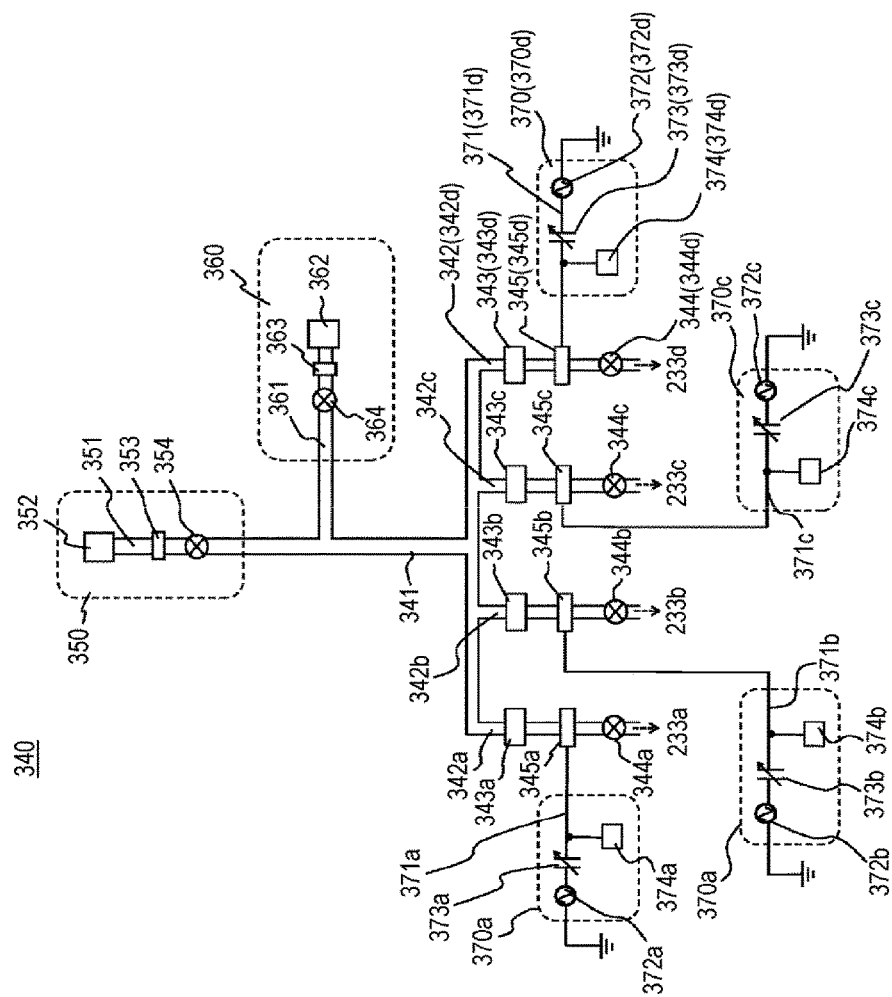
FIG. 6 is an explanatory view illustrating the substrate processing apparatus according to the present embodiment.
Figure 7:
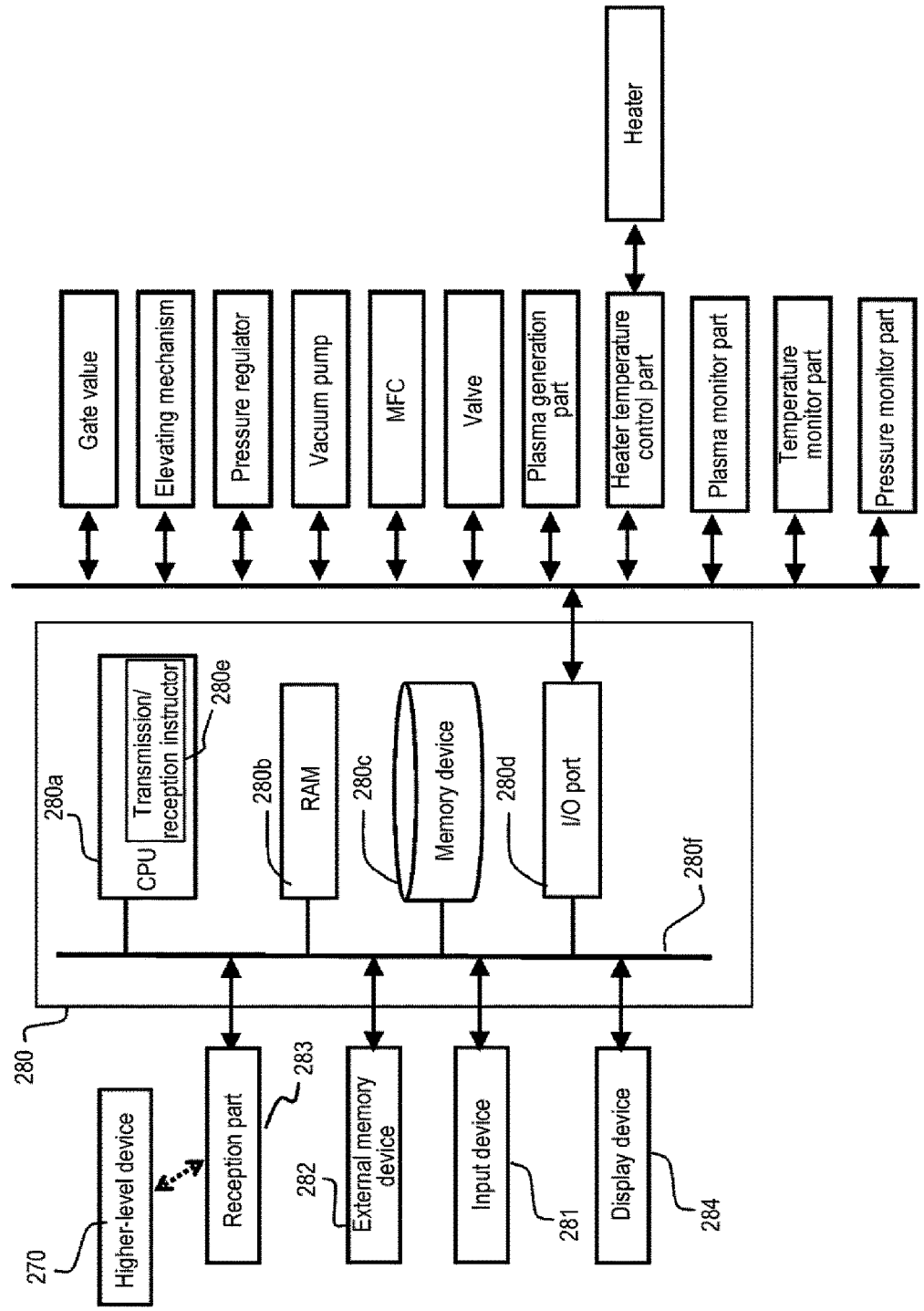
FIG. 7 is an explanatory view illustrating the substrate processing apparatus according to the present embodiment.

A schematic configuration of a substrate processing apparatus according to one embodiment of the present disclosure will be described with reference to FIGS. 1 to 7. FIG. 1 is an explanatory view illustrating a configuration example of the substrate processing apparatus according to the present embodiment. FIG. 2 is a cross sectional view of a module. FIGS. 3 and 4 are views of the module when viewed from above, and are explanatory views illustrating respective components. FIGS. 5 and 6 are explanatory views of a gas supply part for supplying a gas to the module. FIG. 7 is an explanatory view illustrating a controller.

(Substrate Processing Apparatus)

A schematic configuration of a substrate processing apparatus according to one embodiment of the present disclosure will be described with reference to FIG. 1.

A substrate processing apparatus 100, to which the present disclosure is applied, processes a product wafer (PW) (hereinafter, referred to as a PW) as a substrate, and mainly includes an IO stage 110, an atmospheric transfer chamber 120, a load lock chamber 130, a vacuum transfer chamber 140, and modules 200. The PW is, for example, a PW for a product in which a circuit or the like has already been formed.

(Atmospheric Transfer Chamber and IO Stage)

The IO stage (load port) 110 is installed in the front of the substrate processing apparatus 100. A plurality of pods 111 is mounted on the IO stage 110. Each of the pods 111 is used as a carrier for transferring a PW such as a silicon (Si) substrate or the like. A supporting part that supports the plurality of PWs in multiple stages and in a horizontal posture is installed inside each of the pods 111.

The IO stage 110 is positioned adjacent to the atmospheric transfer chamber 120. The atmospheric transfer chamber 120 is connected to the load lock chamber 130, which will be described later, at a surface different from the surface at which the IO stage 110 is connected. An atmospheric transfer robot 122 for transferring the PW is installed inside the atmospheric transfer chamber 120. The atmospheric transfer robot 122 transfers the PW between the load lock chamber 130 and the pods 111.

(Load Lock Chamber)

The load lock chamber 130 is positioned adjacent to the atmospheric transfer chamber 120. The vacuum transfer chamber 140 as described hereinbelow is disposed at a surface of a housing 131 constituting the load lock chamber 130, which is different from that at which the atmospheric transfer chamber 120 is positioned.

The load lock chamber 130 has at least two mounting surfaces 135 on which the PWs are mounted. For example, one mounting surface 135 is configured to mount a processed PW thereon and the other mounting surface 135 is configured to mount an unprocessed PW thereon.

(Vacuum Transfer Chamber)

The substrate processing apparatus 100 includes the vacuum transfer chamber (transfer module) 140 as a transfer chamber serving as a transfer space in which the PWs are transferred under a negative pressure. The load lock chamber 130, the modules 200 (modules 200a to 200b) in which the PWs are processed, and a DW storage chamber 150 in which a plurality of dummy wafers (DWs) (hereinafter, referred to as DWs) is stored are connected to the vacuum transfer chamber 140. A vacuum transfer robot 170 as a transfer part for transferring the PW under a negative pressure is installed at the substantial center of the vacuum transfer chamber 140.

The vacuum transfer robot 170 is configured to be elevated and lowered while maintaining the hermeticity of the vacuum transfer chamber 140 by an elevator and a flange. An arm of the vacuum transfer robot 170 is configured to be rotated or stretched around a shaft. By the rotation or stretching operation of the arm, the PWs may be transferred into and out of the modules 200 or the dummy wafers (DWs) may be transferred into and out of the DW storage chamber 150. Furthermore, the PWs or DWs may be transferred into the modules 200 according to an instruction provided from a controller 280 which will be described later.

(DW Storage Chamber)

The DW storage chamber 150 stores the plurality of DWs. Unlike the PW, the DW is a wafer that is not used as an actual semiconductor device product. In the modules 200, the maximum number of wafers which can be processed in batches is plural (four sheets in FIG. 1). For example, when the number of PWs to be processed does not reach the maximum number of wafers (e.g., three sheets of wafers), the DWs are used to supplement the lack.

For example, in a case where the maximum number of wafers is four sheets and the number of PWs is three sheets, three PWs are mounted on mounting parts of the module 200 on which the substrates are mounted and one DW is mounted on other remaining mounting part. By doing so, there are advantages in that a respective condition approximates to a processing condition of the case where four PWs are mounted or an unnecessary gas is not adhered onto a wafer mounting surface.

Furthermore, the DWs include a patterned DW and an unpatterned DW. A surface area of the patterned DW is closer to a surface area of the PW than a surface area of the unpatterned DW. Thus, when processing the PWs, the state of the process chamber can approximate to the state in which four PWs are mounted by using the patterned DW. By increasing the reproducibility of the process chamber in this manner, the process quality of the PWs can remain within a predetermined range. "Whether to use a DW" or "whether to use a patterned DW or unpatterned DW" in using a DW may be appropriately selected depending on the kind or quality of a film formed by the PW, ultimately the production cost, or the like.

However, since the DW is used in various processes, the surface area of the DW is not always equal to the surface area of the PW. In addition, since the DW is produced at a low cost, relative to the PW, the surface area of the DW may be more reduced than that of the PW in many cases. Thus, although the patterned DW is used, the amounts of the gas to be adsorbed are different between the PW and the DW. Thus, it is difficult to make the processing state of the entire process chamber uniform using the DW. Due to this problem, even with the patterned DW, it is desirable to detect the state of each process chamber as described hereinbelow.

(Module)

A plurality of modules 200 may be installed. For example, two modules 200 may be installed as illustrated in FIG. 1. Here, for the sake of convenience in description, one of them will be referred to as the module 200a and the other will be referred to as the module 200b.

Details of the module 200 will be described with reference to FIGS. 2 to 6. As illustrated in FIG. 2, the module 200 includes a vessel 202. The vessel 202 is configured as, for example, a flat airtight vessel having a rectangular cross section. Furthermore, the vessel 202 is made of a metal material such as, e.g., aluminum (Al) or stainless steel (SUS). A process chamber 201 configured to process a PW such as a silicon wafer or the like and a transfer chamber 206 through which the PW passes when the PW is transferred to the process chamber 201 are formed inside the vessel 202. The process chamber 201 includes a shower head 230, a substrate mounting part 210 and the like, which will be described later. In addition, the transfer space 206 is defined by a rotary tray 222 and a lower portion 204 of the vessel 202.

A substrate loading/unloading port 205 adjacent to a gate valve 208 is installed in a side surface of the vessel 202. The PW is transferred to and from the vacuum transfer chamber 140 through the substrate loading/unloading port 205. A plurality of lift pins 207 is installed in the lower portion 204. Furthermore, a plurality of exhaust holes 261 (261a to 261d) which respectively communicate with a plurality of exhaust pipes 262 (262a to 262d), which will be described later, is formed in the lower portion 204.

The substrate mounting part 210 configured to support the PWs or DWs is disposed in the process chamber 201. A plurality of substrate mounting parts 210 is installed. The arrangement of the plurality of substrate mounting parts 210 will be described with reference to FIG. 3. FIG. 3 illustrates the module 200, particularly the vicinity of the rotary tray 222 when viewed from above. In FIG. 3, the front end of the vacuum transfer robot 170 is shown and the vacuum transfer robot 170 is configured to transfer the PWs into and out of the vessel 202. Furthermore, a longitudinal sectional view taken along the line B-B' corresponds to FIG. 2.

The substrate mounting table 212, which is one component of the substrate mounting part 210, is installed in a plural number. Here, for example, four substrate mounting tables 212 are installed. Specifically, a substrate mounting table 212a, a substrate mounting table 212b, a substrate mounting table 212c, and a substrate mounting table 212d are arranged in a clockwise direction from a position facing the substrate loading/unloading port 205. The PWs carried into the vessel 202 are moved in the order of the substrate mounting table 212a, the substrate mounting table 212b, the substrate mounting table 212c, and the substrate mounting table 212d.

The substrate mounting part 210 mainly has substrate mounting surfaces 211 (a substrate mounting surface 211a to a substrate mounting surface 211d) on which the PWs are mounted, substrate mounting tables 212 (a substrate mounting table 212a to a substrate mounting table 212d) having the substrate mounting surfaces 211, heaters 213 (213a to 213d) serving as heating sources, and shafts 217 (217a to 217b) that support the substrate mounting tables 212. Through holes through which the lift pins 207 pass are formed at positions corresponding to the lift pins 207 in the substrate mounting tables 212, respectively.

Heater control parts 216 (216a to 216d) are connected to the heaters 213 (213a to 213d). The heater control parts 216 adjust a temperature by controlling a state of supplying the electric power to the heaters 213.

Temperature sensors 215 are installed around the heaters 213. Temperature monitor parts 242 (242a to 242d) are connected to the temperature sensors 215 (215a to 215d) via wirings 241 (241a to 241d). The temperature monitor parts 242 transmit the temperature information detected by the temperature sensors 215 to the controller 280 which will be described later. The heater control parts 216 and the temperature monitor parts 242 are electrically connected to the controller 280.

Each of the substrate mounting tables 212 (the substrate mounting tables 212a to 212d) is supported by the respective shafts 217 (the shafts 217a to 217d). The shafts 217 are configured to penetrate the lower portion 204 of the vessel 202, and are connected to respective elevating parts 218 (elevating parts 218a to 218d) installed outside the vessel 202. The shafts 217 are insulated from the vessel 202.

The elevating parts 218 are configured to elevate or lower the shafts 217 and the substrate mounting tables 212. Furthermore, the periphery of the lower end portion of each of the shafts 217 is covered with a bellows 219, so that the interior of the vessel 202 is hermetically kept.

The substrate mounting table 212 is lowered so that the substrate mounting surfaces 211 and the rotary tray 222 are positioned opposite the substrate loading/unloading port 205 when the PWs are transferred. As illustrated in FIG. 2, the substrate mounting table 212 is elevated until the PWs reach a process position within a process space 209 when the PWs are processed.

Shower heads 230 (230a to 230d), which are gas dispersion mechanisms, are installed at a position of a lid portion 203 of the vessel 202 facing each of the substrate mounting surfaces 211. As illustrated in FIG. 4, the plurality of shower heads 230 is arranged when viewed from above. The shower heads 230 are supported by the lid 203 via insulating rings 232 (232a to 232d). The shower heads 230 and the vessel 202 are insulated from each other by the insulating rings 232. First gas introduction holes 231 (231a to 231d) and second gas introduction holes 233 (233a to 233d) are formed in the lid of each of the shower heads 230 (230a to 230d). Each of the first gas introduction holes 231 communicates with a common gas supply pipe 311 which will be described later. Each of the second gas introduction holes 233 communicates with a common gas supply pipe 341 which will be described later. Furthermore, a longitudinal sectional view taken along line A-A' in FIG. 4 corresponds to FIG. 2.

A space between each shower head 230 and each substrate mounting surface 211 will be referred to as the process space 209. In the present embodiment, a space between the shower head 230a and the substrate mounting surface 211a will be referred to as a process space 209a. A space between the shower head 230b and the substrate mounting surface 211b will be referred to as a process space 209b. A space between the shower head 230c and the substrate mounting surface 211c will be referred to as a process space 209c. A space between the shower head 230d and the substrate mounting surface 211d will be referred to as a process space 209d.

Furthermore, a structure constituting the process space 209 will be referred to as the process chamber 201. In the present embodiment, a structure which constitutes the process space 209a and includes at least the shower head 230a and the substrate mounting surface 211a will be referred to as a process chamber 201a. A structure which constitutes the process space 209b and includes at least the shower head 230b and the substrate mounting surface 211b will be referred to as a process chamber 201b. A structure which constitutes the process space 209c and includes at least the shower head 230c and the substrate mounting surface 211c will be referred to as a process chamber 201c. A structure which constitutes the process space 209d and includes at least the shower head 230d and the substrate mounting surface 211d will be referred to as a process chamber 201d. The process chambers 201a to 201d communicate with each other.

In addition, it has been described herein that the process chamber 201 includes at least the shower head 230a and the substrate mounting surface 211a, but any structure may be used as long as it constitutes the process space 209 configured to process the PWs, and it is to be understood that it is independent on the structure of the shower heads 230 depending on an apparatus structure.

As illustrated in FIG. 3, each of the substrate mounting parts 210 is disposed around a shaft 221 of a substrate rotation part 220. The rotary tray 222 is installed on the shaft 221. Furthermore, the shaft 221 is configured to penetrate the lower portion 204 of the vessel 202. A rotation elevating part 223 is installed outside the vessel 202, namely on a side different from the side at which the rotary tray 222 is installed. The rotation elevating part 223 is configured to elevate or lower the shaft 221 or rotate it. With the rotation elevating part 223, it is possible to elevate or lower the shaft 221 independently from each substrate mounting part 210. A bellows 226 is installed around a lower end of the shaft 221 and outside the vessel 202. The rotational direction is, for example, the direction of the arrow 225 (clockwise direction) in FIG. 3. The shaft 221, the rotary tray 222, and the rotation elevating part 223 will be collectively referred to as the substrate rotation part 220. The substrate rotation part 220 will also be referred to as a substrate transfer part.

The rotary tray 222 is formed in, for example, a circular shape. Hole portions 224 (224a to 224d) having at least the same diameter as that of the substrate mounting surfaces 211 are formed to have the same number as that of the substrate mounting parts 210 at an outer peripheral end of the rotary tray 222. Furthermore, the rotary tray 222 has a plurality of hooks protruding inward the hole portions 224. The hooks are configured to support the rear surfaces of the PWs or DWs. In the present embodiment, the expression "mounting the PWs or DWs in the hole portions 224" means that the PWs or DWs are mounted on the hooks.

As the shaft 221 elevates, the rotary tray 222 is located at a position higher than the substrate mounting surfaces 211. At this time, the PWs or DWs mounted on the substrate mounting surface 211 are picked up by the hooks. Furthermore, as the shaft 221 rotates, the rotary tray 222 is rotated and the picked-up PWs or DWs are moved onto the subsequent substrate mounting surface 211. For example, the PWs or DWs mounted on the substrate mounting surface 211b are moved onto the substrate mounting surface 211c. Thereafter, the shaft 221 is lowered so that the rotary tray 222 is lowered. At this time, the hole portions 224 are lowered until they are positioned below the substrate mounting surfaces 211, and the PWs or DWs are mounted on the substrate mounting surface 211.

(Exhaust System)

An exhaust system 260 configured to exhaust an internal atmosphere of the vessel 202 will be described. The exhaust system 260 is installed to correspond to each of the process spaces 209 (209a to 209d). For example, an exhaust system 260a corresponds to the process space 209a, an exhaust system 260b corresponds to the process space 209b, an exhaust system 260c corresponds to the process space 209c, and an exhaust system 260d corresponds to the process space 209d.

The exhaust system 260 includes exhaust pipes 262 (262a to 252d) which communicate with the exhaust holes 261 (261a to 261d), and further includes auto pressure controllers (APCs) 266 (266a to 266d) installed in the respective exhaust pipes 262. The APC 266 includes a valve element (not shown) whose opening degree is adjustable, and is configured to adjust the conductance of the exhaust pipe 262 according to an instruction provided from the controller 280. In addition, valves 267 (267a to 267d) are installed in the exhaust pipes 262 at the upstream side of the APCs 266. Pressure monitor parts 268 (268a to 268d) configured to measure the pressure of the exhaust pipes 262 are installed at the downstream side of the valves 267.

The pressure monitor parts 268 serve to monitor the pressure of the exhaust pipes 262. Since the exhaust pipes 262 and the process spaces 209 communicate with each other, they indirectly monitor the pressure of the process spaces 209 (209a to 209d). The pressure monitor parts 268 are electrically connected to the controller 280, and transmit the detected pressure data to the controller 280.

The exhaust pipe 262, the valve 267, and the APC 266 will be collectively referred to as the exhaust system 260.

Furthermore, the exhaust pipe 262, the pressure monitor part 268, the valve 267, and the APC 266 will be collectively referred to as an exhaust part. A dry pump (DP) 269 is installed at the downstream side of the exhaust pipe 262. The DP 269 is configured to exhaust the internal atmosphere of the process chamber 201 via the exhaust pipe 262. In FIG. 2, the DP 269 is installed in each exhaust system 260. However, the present disclosure is not limited thereto and the DP 269 may be installed common to each exhaust system.

(Gas Supply Part)
(First Gas Supply Part 310)

Next, a first gas supply part 310 will be described with reference to FIG. 5. Here, the first process gas supply part 310 connected to each gas introduction hole 231 will be described.

The shower heads 230 (230a to 230d) are connected to the common gas supply pipe 311 via distribution pipes 312 (312a to 312d) so that the gas introduction holes 231 (231a to 231d) and the common gas supply pipe 311 communicate with each other. Mass flow controllers (MFCs) 313 (313a to 313d), which are flow rate controllers (flow rate control parts), and valves 314 (314a to 314d) are installed in the distribution pipes 312 from the corresponding upstream sides. The supply amount of the gas to each process chamber is adjusted using the valves 314 and the MFCs 313. A first gas supply pipe 321 and a second gas supply pipe 331 are connected to the common gas supply pipe 311.

A first gas source 322, an MFC 323, and a valve 324 as an opening/closing valve are installed in the first gas supply pipe 311 sequentially from the corresponding upstream side.

The first gas source 322 is a source of a first gas containing a first element (also referred to as a "first element-containing gas"). The first element-containing gas is a precursor gas, namely one of the process gases. Here, the first element is silicon (Si). That is to say, the first element-containing gas is a silicon-containing gas. Specifically, as the silicon-containing gas, it may be possible to use a dichlorosilane ($SiH_2Cl_2$, also referred to as DCS) gas or a hexachlorodisilane ($Si_2Cl_6$, also referred to as HCDS) gas.

A first gas supply system 320 (also referred to as a silicon-containing gas supply system) is mainly configured by the first gas supply pipe 321, the MFC 323, and the valve 324.

A second gas source 332, an MFC 333, and a valve 334 are installed in the second gas supply pipe 331 sequentially from the corresponding upstream side. The second gas source 332 is an inert gas source. The inert gas is, for example, a nitrogen ($N_2$) gas.

A second gas supply system 330 is mainly configured by the second gas supply pipe 331, the MFC 333, and the valve 334.

The inert gas supplied from the second gas supply system 330 acts as a purge gas for purging the gas remaining in the vessel 202 or the shower heads 230 in a substrate processing step.

Any one of the common gas supply pipe 311, the distribution pipes 312, the first gas supply system 320, and the second gas supply system 330, or a combination thereof will be referred to as the first gas supply part 310.

(Second Gas Supply Part 340)

Next, a second gas supply part 340 will be described with reference to FIG. 6. Here, the first gas supply part 340 connected to each gas introduction hole 233 will be described.

The shower heads 230 (230a to 230d) are connected to the common gas supply pipe 341 via distribution pipes 342 (342a to 342d) so that the gas introduction holes 233 (233a to 233d) and the common gas supply pipe 341 communicate with each other. MFCs 343 (343a to 343d) and valves 344 (344a to 344d) are installed in the distribution pipes 342 from the corresponding upstream sides. The MFCs 343 (343a to 343d) and the valves 344 (344a to 344d) are installed in the distribution pipes 342 (342a to 342d). The supply amount of the gas to each process chamber 201 is adjusted using the valves 344 and the MFCs 343. A third gas supply pipe 351 and a fourth gas supply pipe 361 are connected to the common gas supply pipe 341.

Plasma generation parts 345 (345a to 345d) are further installed in each distribution pipe 342. The plasma generation parts 345 will also be referred to as remote plasma parts, and plasmarize the gas passing through the distribution pipes 342. Wirings and power sources, which will be described later, are electrically connected to the respective plasma generation parts 345.

A third gas source 352, an MFC 353, and a valve 354 are installed in the third gas supply pipe 351 sequentially from the corresponding upstream side.

The third gas source 352 is a second element-containing gas source. The second element-containing gas contains a second element different from the first element. The second element is, for example, nitrogen (N). In the present embodiment, the second element-containing gas is, for example, a nitrogen-containing gas. Specifically, as the nitrogen-containing gas, it may be possible to use an ammonia ($NH_3$) gas.

A third gas supply system 350 is mainly configured by the third gas supply pipe 351, the MFC 353, and the valve 354.

A fourth gas source 362, an MFC 363, and a valve 364 are installed in the fourth gas supply pipe 361 sequentially from the corresponding upstream side. The fourth gas source 362 is an inert gas source. The inert gas is, for example, a nitrogen ($N_2$) gas.

A fourth gas supply system 360 is mainly configured by the fourth gas supply pipe 361, the MFC 363, and the valve 364. The inert gas supplied from the fourth gas supply system 360 acts as a purge gas for purging the gas remaining in the vessel 202 or the shower heads 230 in the substrate processing step.

Furthermore, any one of the common gas supply pipe 341, the distribution pipes 342, the third gas supply system 350, and the fourth gas supply system 360, or a combination thereof will be referred to as the second gas supply part 340. The fourth gas source 362 may also be common to the second gas source 332 described above. The MFC 343, the valve 344, and the plasma generation part 345 may also be included in the second gas supply part 340.

(Plasma Control Part)

Next, plasma control parts 370 will be described.

The plasma control parts 370 (370a to 370d) are electrically connected to the plasma generation parts 345 (345a to 345d) to control the plasma generation parts 345, respectively.

Next, a specific configuration of each plasma control part 370 will be described.

The plasma generation parts 370 include respective wirings 371 (371a to 371d). High-frequency power sources 372 (372a to 372d) and matchers 373 (373a to 373d) are installed in the wirings 371, respectively. One end of each of the high-frequency power sources 372 is grounded. By supplying the electric power from the high-frequency power sources 372 to the plasma generation parts 345, the gas passing through the distribution pipes 342 is turned into plasma.

Plasma monitor parts 374 (374a to 374d) are installed between the matchers 373 and the plasma generation parts 345. The plasma monitor parts 374 detect, for example, a reflective wave when the electric power is supplied to the plasma generation parts 345, and monitor a generation state of plasma. Furthermore, the plasma monitor parts 374 supply the detected data to the controller 280. When the reflective wave is close to zero, the controller 280 determines that desired plasma was generated in the shower heads.

The wirings 371 (371a to 371d), the high-frequency power sources 372 (372a to 372d), and the plasma monitor parts 374 (374a to 374d) will be collectively referred to as the plasma control parts 370 (370a to 370d).

Furthermore, in the present embodiment, any one of the temperature monitor parts 242, the pressure monitor parts 268, and the plasma monitor parts 374, or a combination thereof will be referred to as a process chamber state monitor part. The data detected by the process chamber state monitor part will be referred to as process chamber data.

(Controller)

The substrate processing apparatus 100 includes the controller 280 that controls the operations of the respective parts of the substrate processing apparatus 100.

An outline of the controller 280 is illustrated in FIG. 7. The controller 280, which is a control part (control means), may be configured as a computer including a central processing unit (CPU) 280a, a random access memory (RAM) 280b, a memory device 280c as a memory part, and an I/O port 280d. The RAM 280b, the memory device 280c and the I/O port 280d are configured to exchange data with the CPU 280a via an internal bus 280f. The transmission and reception of the data in the substrate processing apparatus 100 is performed according to an instruction provided from a transmission/reception instructor 280e which is also one function of the CPU 280a.

In addition, the CPU 280a has a function of comparing the data detected by each monitor part with other data. Furthermore, the CPU has a function of displaying these data on a display device 284 which will be described later. The other data refers to an initial value of a control value recorded in advance in the memory device 280c, the best data detected by each monitor part, or the like. The other data may be the data of another substrate processing apparatus or data of another module. The CPU 280a may compare the data detected by each monitor part with other data and control the heaters, the valves, or the like so that these data are matched with each other.

An input device 281 configured as, for example, a keyboard or the like, and an external memory device 282 may be connected to the controller 280. Furthermore, a reception part 283 connected to a higher-level device 270 via a network is installed. The reception part 283 may receive a process information or the like of the PWs stored in the pods 111 from the higher-level device 270. The process information is, for example, information about a film or a pattern formed on the PWs.

The data detected by each monitor part, or the like is displayed on the display device 284. Furthermore, in the present embodiment, the display device is described as a separate component from the input device 281, but the present disclosure is not limited thereto. For example, if the input device also serves as a display screen such as a touch panel or the like, the input device 281 and the display device 284 may be configured as a single component.

The memory device 280c is configured by, for example, a flash memory, a hard disk drive (HDD), or the like. A process recipe for specifying sequences and conditions of a substrate process as described hereinbelow, a recipe program as a control program for controlling operations of the substrate processing apparatus to realize the process recipe, a table as described hereinbelow, or the like is readably stored in the memory device 280c. The recipe program functions as a program for causing the controller 280 to execute each sequence in the substrate processing step (to be described later) to obtain a predetermined result. Hereinafter, the recipe program and the control program will be generally and simply referred to as a "program". When the term "program" is used herein, it may indicate a case of including only the process recipe, a case of including only the control program, or a case of including both the process recipe and the control program. The RAM 280b is configured as a memory area (work area) in which a program or data read by the CPU 280a is temporarily stored.

The memory device 280c stores a monitor data table in which the data detected by each monitor part is recorded. In the table, the initial value or the like set for the device installation is recorded. The monitor data is data detected by, for example, any one of the plasma monitor parts 374, the pressure monitor parts 268, and the temperature monitor parts 242. Each monitor data is written in real time, and the data is accumulated over time. The monitored data is displayed on the display device 284. When displayed, the data detected by the monitor parts and reference data are displayed on the same screen so that the user can intuitively recognize the state of the device. The reference data mentioned herein is, for example, the initial value, and data of other modules and other processes. Details of the reference data will be described hereinbelow.

The I/O port 280*d* is connected to the respective components of the substrate processing apparatus 100 such as each gate valve 208, the elevating mechanism 218 installed in the module, each pressure regulator, each pump, the temperature monitor part 242, the plasma monitor part 374, the pressure monitor part 268, the arm 170, and the like.

The CPU 280*a* is configured to read the control program from the memory device 280*c* and execute the same. The CPU 280*a* also reads the recipe program from the memory device 280*c* according to an input of an operation command from the input/output device 281. In addition, the CPU 280*a* is configured to control, according to the contents of the recipe program thus read, the opening/closing operation of the gate valves 208, the operation of the robot 170, the elevating and lowering operation by the elevating mechanisms 218 and 223, the operations of the temperature monitor parts 242, the plasma monitor parts 374 and the pressure monitor parts 268, the ON/OFF operation of each pump, the flow rate adjusting operation performed by the MFCs, the opening/closing operation of the valves, and the like.

The controller 280 according to the present embodiment may be configured by installing, on the computer, the aforementioned program stored in the external memory device 282 (for example, a magnetic disk such as a hard disk, an optical disc such as a DVD, a magneto-optical disc such as an MO, or a semiconductor memory such as a USB memory). Furthermore, means for supplying the program to the computer is not limited to a case of supplying the program via the external memory device 282. For example, the program may be supplied to the computer using a communication means such as the Internet or a dedicated line, instead of using the external memory device 282. In addition, the memory device 280*c* or the external memory device 282 is configured as a non-transitory computer-readable recording medium. Hereinafter, the memory device 280*c* and the external memory device 282 will be generally and simply referred to as a "recording medium." When the term "recording medium" is used herein, it may indicate a case of including only the memory device 280*c*, a case of including only the external memory device 282, or a case of including both the memory device 280*c* and the external memory device 282.

(Substrate Processing Method)

Figure 8:
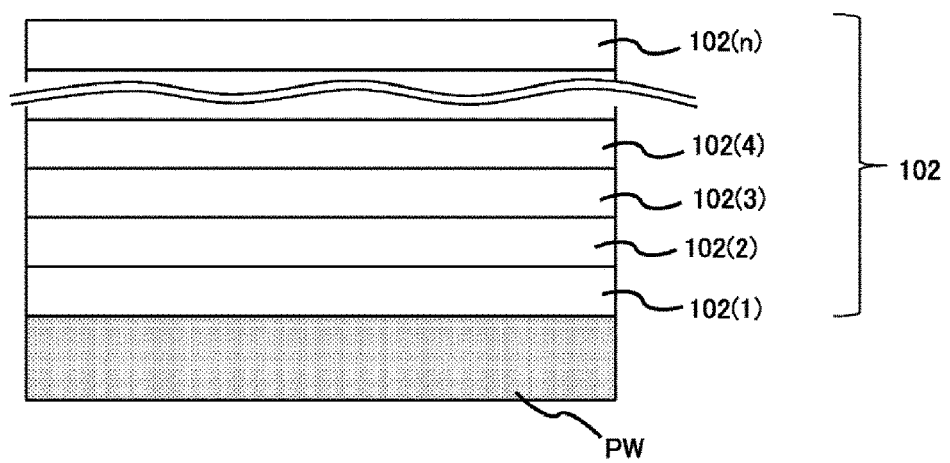
FIG. 8 is an explanatory view illustrating a processing state of a substrate according to an embodiment of the present disclosure.

Next, a substrate processing method will be described. Here, as illustrated in FIG. 8, a film 102 is formed on a PW. The film 102 is, for example, a silicon nitride film (SiN film). The film 102 includes films 102(1) to 102(*n*) (where n= 2, . . . , n).

As will be described later, for example, the film 102(1) of the PW is formed in the process space 209*a*, the film 102(2) is formed in the process space 209*b*, and the film 102(3) is formed in the process space 209*c*, and the film 102(4) is formed in the process space 209*d*.

Subsequently, the relationship between a PW, a DW, each process space 209, and each step described below will be described with reference to FIG. 9. In FIG. 8, it is assumed here that n=4 and the number of layers is 4 for explanation. That is to say, an example in which the films 102(1) to 102(4) are formed in the PW will be described.

Figure 9:
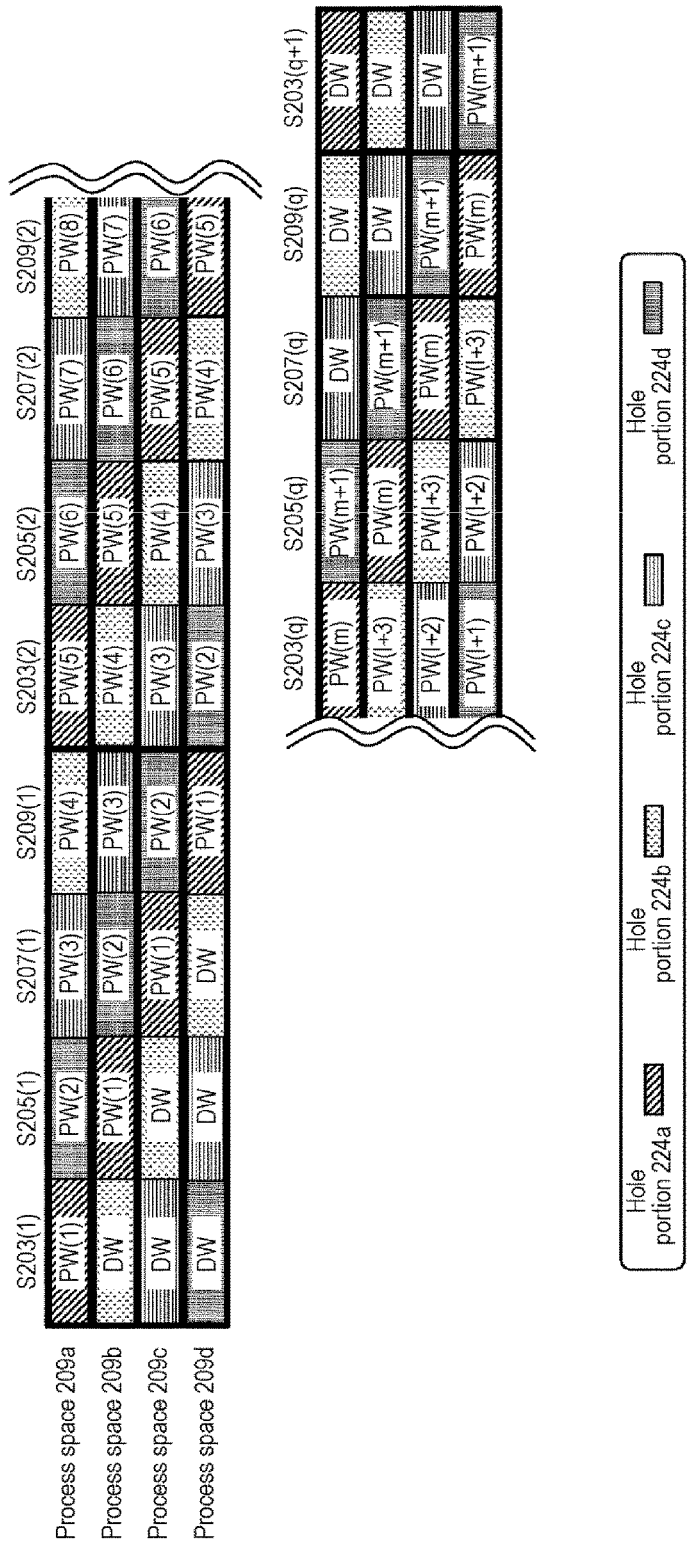
FIG. 9 is an explanatory view illustrating a state transition in a substrate processing apparatus according to the present embodiment.

With reference to FIG. 9, one lot of process will be illustrated. The vertical axis represents the process spaces 209*a* to 209*d* and the horizontal axis represents processing steps S203, S205, S207, and S209 as described hereinbelow. ( ) in the processing steps denotes the number q of repeating the processing steps S203, S205, S207, and S209. q is an arbitrarily set depending on the number of wafers per lot.

In the PW, ( ) denotes the number of processed product wafers (PWs) in one lot. For example, PW(1) denotes a first product wafer PW, and PW(m) denotes an mth product wafer PW. DW denotes a dummy wafer (DW).

Furthermore, as illustrated in the lower portion in FIG. 9, the shadows and each hole portion 224 are linked. In addition, the type of wafer is described on each shadow. For example, at S207(1), a hole portion 224*c* in which a PW(3) is mounted is disposed in the process space 209*a* and processed. Similarly, a hole portion 224*d* in which a PW(2) is mounted is disposed in the process space 209*b* and processed.

In FIG. 9, a step of moving a wafer, such as S201 or the like, is omitted and only a step of supplying the gas to the PW or DW is illustrated. At steps S203, S205, S207, and S209, each monitor part detects a state of the process chamber 201 in parallel with the formation of a film, and the detected data is recorded in the monitor data table.

Next, specific contents of each step in the substrate processing method will be described.

(S201)

Here, a substrate moving step S201 of loading a PW will be described. The vacuum transfer robot 170 enters the process chamber 201 from the substrate loading/unloading port 205 to mount the PW in the hole portions 224 of the rotary tray 220. At this step, a PW(1) as the first product wafer is mounted in the hole portion 224*a* adjacent to the substrate loading/unloading port 205. Furthermore, in the present embodiment, the process chamber 201 in which the PW(1) is initially loaded will be referred to as a first process chamber, and a process chamber other than the first process chamber will be referred to as another process chamber.

After the PW(1) is mounted, the rotary tray 220 is lowered. At this time, each substrate mounting surface 211 is relatively elevated up to a position higher than the surface of the rotary tray 220. By this operation, the PW(1) is mounted on the substrate mounting surface 211*a*. If the PW(1) is mounted on the substrate mounting surface 211*a*, the gate valve 208 is closed to hermetically seal the inside of the vessel 202. In this manner, the PW(1) is moved to process space 209*a*. Furthermore, as illustrated at S203(1) of FIG. 9, when the number of PWs is smaller than the maximum number of wafers processed in the module, the gas is not adhered to the substrate mounting surfaces 211*b*, 211*c*, and 211*d*. For example, as illustrated at S203(1) of FIG. 9, the DW may be mounted in a hole portion 224*b*, a hole portion 224*c*, or a hole portion 224*d*. Alternatively, while the PW(1) is being processed, an inert gas may be supplied toward the substrate mounting surfaces 211*b*, 211*c*, and 211*d* to prevent the gas from entering from the process chamber S201*a* (the process space 209*a*).

When the PW is mounted on each substrate mounting table 212, the electric power is supplied to each heater 213 to control the surface of the PW to have a predetermined temperature. The temperature of the PW may fall within a range of to within a range of, for example, room temperature to 800 degrees C., specifically room temperature to 700 degrees C. At this time, the temperature of the heater 213 is adjusted by extracting a control value by the controller 280 based on the temperature information detected by the temperature sensor 215 and controlling a state of supplying the electric power to the heater 213 by the heater control part 216.

(S202)

Here, a recipe reading step will be described. The controller 280 reads a recipe program depending on the type and number of substrate from the memory device 280c. Specifically, when the DW is not used, the controller 280 reads a DW-less recipe program at S203(1). When the DW is used, the controller 280 reads a DW-based recipe.

The number described above refers to the number of PWs processed at S203(1) or the number of processed PWs per lot. For example, in the case of the number of PWs processed at S203(1), one sheet of PW starts to be processed as at S203(1) of FIG. 9, or in the case of changing to two sheets of PWs at S203(1), the two sheets of PWs start to be processed. In each case, a recipe program is selected. In addition, the number of PWs is determined by the CPU 280a based on the information of the PW received from the higher-level device 270 and the information of the maximum number of wafers processed in the module 200.

Furthermore, although each heater 213 is controlled at the substrate moving step S201, this control may be performed based on the recipe read at this step. In addition, for the sake of convenience in description, S202 has been described after the substrate moving step S201. However, the present disclosure is not limited thereto and S201 may be performed after S202, or S201 and S202 may be performed at the same time.

(S203)

A substrate processing step will be described. At this step, each component is controlled by the recipe program read at S202 to form a film 102(1) on the PW(1). After the PW(1) moved to the process space 209a is maintained at a predetermined temperature, the first gas supply part 310 and the second gas supply part 340 are controlled such that a first gas and a second gas are supplied to the process space 209a but not supplied to other process spaces 209b, 209c, and 209d. When the second gas, e.g., an $NH_3$ gas, supplied from the second gas supply part 340 is turned into a plasma state, the $NH_3$ gas is supplied while operating the plasma generation part 345. The first gas and the second gas react with each other within the process chamber 201a to form the film 102(1) on the PW(1).

When the DW is not used, an inert gas is supplied to the process chambers 201b, 201c, and 201d in which the PW does not exist, thereby forming a gas curtain. Thus, the gas supplied to the process chamber 201a is controlled to be not supplied to the substrate mounting surfaces 211b, 211c, and 211d.

When the DW is used, an inert gas is supplied to the process chambers 201b, 201c, and 201d in a state in which the DW is mounted on each of the substrate mounting surfaces 211b, 211c, and 211d.

When the PW exists in all the process spaces 209a, 209b, 209c, and 209d as at S203(2) of FIG. 9, a recipe program corresponding to "the PW exists in the process spaces 209a, 209b, 209c, and 209d" is read. Based on the recipe program thus read, a process gas is supplied to each of the process chambers 201a, 201b, 201c, and 201d to form a film 102. In addition, the recipe program used at that time may be a DW-less recipe or a DW-based recipe.

During the substrate processing step S203, the process chamber monitor part monitors a state of each process chamber 201. For example, the pressure monitor part 268a detects an internal pressure of the process chamber 201a, the pressure monitor part 268b detects an internal pressure of the process chamber 201b, the pressure monitor part 268c detects an internal pressure of the process chamber 201c, and the pressure monitor part 268d detects an internal pressure of the process chamber 201d. The data thus detected is stored in the memory device 280c and also displayed on the display device 284.

(S204)

Here, a substrate moving step of moving the PW(1) and loading the PW(2) will be described. If the film 102(1) is formed on the PW(1) after a predetermined period of time, the supply of the first gas and the second gas is stopped. Thereafter, the rotary tray 222 is elevated to separate the PW(1) from the substrate mounting surface 211a. After the separation, the rotary tray 222 is rotated by 90 degrees in a clockwise direction such that the hole portion 224a is moved onto the substrate mounting surface 211b. Upon completion of the rotation, the hole portion 224a is positioned above the substrate mounting surface 211b and the hole portion 224d is positioned above the substrate mounting surface 211a. Upon completion of the rotation, the gate valve 208 is opened and the PW(2) is mounted in the hole portion 224d. When the DW is used, the DW mounted in the hole portion 224d are replaced with the PW(2).

After each PW is mounted, each substrate mounting surface 211 is relatively elevated to mount the PW(1) mounted in the hole portion 224a on the substrate mounting surface 211b and mount the PW(2) mounted in the hole portion 224d on the substrate mounting surface 211a. That is to say, the PW(1) is moved to the process space 209b and the PW(2) is moved to the process space 209a. Furthermore, when the DW exists, the DW is also moved to the process space 209 presented at a downstream side in a rotational direction.

(S205)

Here, a substrate processing step of processing the PW(2) in the process space 209 a and the PW(1) in the process space 209 b will be described.

(Process in Process Spaces 209a and 209b)

In the process space 209a, the same process as that in the process space 209a at S202 is performed to form a film 102(1) on the PW(2). Furthermore, similar to the process space 209a, in the process space 209b, the gas is supplied to form the film 102(2) on the film 102(1) formed on the PW(1).

(Process in Process Spaces 209c and 209d)

When the DW is not used, the gas curtain is formed by supplying an inert gas to the process chambers 201c and 201d in which the PW does not exist. Thus, the gas supplied to the process chambers 201a and 201b is controlled to be not supplied to the substrate mounting surfaces 211c and 211d.

When the DW is used, an inert gas is supplied to the process chambers 201c and 201d in a state in which the DW is mounted on the substrate mounting surfaces 211c and 211d.

As illustrated at S205(2) of FIG. 9, when the PW exists in all the process spaces 209a, 209b, 209c, and 209d, a process gas is supplied to each of the process chambers 201a, 201b, 201c, and 201d to form the film 102.

During the substrate processing step S205, the process chamber monitor part monitors a state of each process chamber 201. For example, the pressure monitor part 268a detects an internal pressure of the process chamber 201a, the pressure monitor part 268b detects an internal pressure of the process chamber 201b, the pressure monitor part 268c detects an internal pressure of the process chamber 201c, and the pressure monitor part 268d detects an internal pressure of the chamber 201d. The data thus detected is stored in the memory device 280c and also displayed on the display device 284.

(S206)

Here, a substrate moving step S206 of moving the PW(1) and PW(2) and loading the PW(3) will be described. If the film 102(2) is formed on the PW(1) and the film 102(1) is formed on the PW(2) after a predetermined period of time, the supply of the process gas is stopped. Thereafter, the rotary tray 222 is elevated to separate the substrate from each of the substrate mounting surface 211a and the substrate mounting surface 211b, the PW(1) is mounted on the substrate mounting surface 211c and the PW(2) is mounted on the substrate mounting surface 211b in the same manner as at S203. Furthermore, the PW(3) is loaded and mounted in the hole portion 224c. Similar to the other PWs, the PW(3) is mounted on the substrate mounting surface 211a. When the DW is used, the DW mounted in the hole portion 224c are replaced with the PW(3).

(S207)

Here, a substrate processing step S207 of processing a substrate in the process space 209a, the process space 209b, and the process space 209c where the PW exists will be described.

(Process in Process Space 209a, Process Space 209b, and Process Space 209c)

In the process space 209a, the same process as at S202 is performed to form a film 102(1) on the PW(3). In the process space 209a, the same process as in the process space 209a at S202 is performed to form the film 102(1) on the PW(3). Similar to the process space 209a, in the process space 209b, the gas is supplied to form the film 102(2) on the film 102(1) formed on the PW(2). Similar to the process space 209a, in the process space 209c, the gas is supplied to form a film 102(3) on the film 102(2) formed on the PW(1).

(Process in Processing Space 209d)

When the DW is not used, the gas curtain is formed by supplying an inert gas to the process chamber 201d in which the PW does not exist. Thus, the gas supplied to the process chambers 201a, 201b, and 201c is controlled to be not supplied to the substrate mounting surface 211d.

When the DW is sued, an inert gas is supplied to the process chamber 201d in a state in which the DW is mounted on the substrate mounting surface 211d.

As illustrated at S207(2) of FIG. 9, when the PW exists in all the processing spaces 209a, 209b, 209c, and 209d, a process gas is supplied to each of the process chambers 201a, 201b, 201c, and 201d to form the film 102.

During the substrate processing step S207, the process chamber monitor part monitors a state of each process chamber 201. For example, the pressure monitor part 268a detects an internal pressure of the process chamber 201a, the pressure monitor part 268b detects an internal pressure of the process chamber 201b, the pressure monitor part 268c detects an internal pressure of the process chamber 201c, and the pressure monitor part 268d detects an internal pressure of the chamber 201d. The data thus detected is stored in the memory device 280c and also displayed on the display device 284.

(S208)

Here, a substrate moving step S208 of moving the PW(1), the PW(2) and the PW(3), and loading the PW (4) will be described.

If the film 102(3) is formed on the PW(1), the film 102(2) is formed on the PW(2), and the film 102(1) is formed on the PW(3) after a predetermined period of time, the supply of the process gas is stopped. Thereafter, the rotary tray 222 is elevated to separate the substrate from each of the substrate mounting surface 211a, the substrate mounting surface 211b, and the substrate mounting surface 211c, and to mount the PW(1) on the substrate mounting surface 211d, mount the PW(2) on the substrate mounting surface 211c, and mount the PW(3) on the substrate mounting surface 211b in the same manner as at S203 and S205. Furthermore, the PW (4) is loaded and mounted in the hole portion 224b. Similar to the other PWs, the PW(4) is mounted on the substrate mounting surface 211a. When the DW is used, the DW mounted in the hole portion 224b is replaced with the PW(4).

(S209)

Here, a substrate processing step S209 of processing a substrate in the process chamber 201a, the process chamber 201b, the process chamber 201c, and the process chamber 201d in which the PW exists will be described.

(Process in Process Space 209a, Process Space 209b, Processing Space 209c, Process Space 209d)

In the process space 209a, the same process as at S202 is performed to form the film 102(1) on the PW(4). In the process space 209b, the same process as in the process space 209a at S202 is performed to form the film 102(2) on the PW(3). Similar to the process space 209a, in the process space 209c, the gas is supplied to form the film 102(3) on the film 102(2) formed on the PW(2). Similar to the process space 209a, in the process space 209d, the gas is supplied to form a film 102(4) on the film 102(3) formed on the PW(1).

During the substrate processing step S209, the process chamber monitor part monitors a state of each process chamber 201. For example, the pressure monitor part 268a detects an internal pressure of the process chamber 201a, the pressure monitor part 268b detects an internal pressure of the process chamber 201b, the pressure monitor part 268c detects an internal pressure of the process chamber 201c, and the pressure monitor part 268d detects an internal pressure of the chamber 201d. The data thus detected is stored in the memory device 280c and also displayed on the display device 284.

(S210)

Here, a step S209 of moving the PW(1), the PW(2), the PW(3), and the PW (4) and replacing the processed PW(1) with a PW(5) to be newly processed will be described.

Upon complement of the film formation, the rotary tray 222 is relatively elevated to separate each PW from the substrate mounting surfaces 211 and is also rotated by 90 degrees. If the PW is moved onto the substrate mounting surface 100a, the gate valve 208 is opened and the PW(1) is replaced with the unprocessed PW(5). Thereafter, the processing steps S202 to S209 are repeated until a predetermined number of substrates are completely processed.

Next, the reasons for detecting the process chamber data at the processing steps S203, S205, S207, and S209 will be described. In order to enhance the reproducibility of substrate process in the apparatus for rotating the wafer as in the present embodiment, it is desirable that each of the process spaces 209a to 209d at each step is in a uniform state. The state mentioned herein is, for example, a pressure distribution of the process spaces 209.

As illustrated in FIG. 2, the process chamber 201 constituting the process spaces 209 is asymmetrical about the substrate mounting part 210. Specifically, for example, in the process chamber 201b, the exhaust system 260b is installed at an outer peripheral side of the module 200, and the central surface of the rotary tray 220 is formed at the central side of the module 200. Furthermore, the other process chambers 201a, 201c, and 201d communicate with each other. Thus, in the process chamber 201b, an aspect that the gas flows in the outer peripheral direction and an aspect that the gas flows in the center direction of the vessel 202 are different.

In addition, since the substrate loading/unloading port 205 adjacent to the process chamber 201*a* affects the flow of the gas, the gas flow aspect of the process chamber 201*a* is different from those of the other process chambers 201*b* to 201*d*.

Due to this structure, each of the other exhaust systems 260*a*, 260*c*, and 260*d*, as well as the exhaust system 260*b*, is adjusted such that the pressure distribution of the process chamber 201*b* is uniform. Similarly, in the other process chambers 201*a*, 201*c*, and 201*d*, the pressure distribution is also adjusted in the other exhaust systems, as well as in the exhaust systems respectively corresponding to the process chambers.

Furthermore, when the DW is used, the surface area of the DW is smaller than that of the PW as mentioned above. Thus, the gas consumption of the DW is smaller than that of the PW. Therefore, when the same amount of process gas is supplied to all the process spaces 209, a surplus gas is generated in the process space 209 where the DW is disposed.

In order to avoid this, a method of supplying an inert gas to the process space 209 where the DW is disposed as described above may be considered. However, it is concerned that the insert gas enters the adjacent process space 209. For example, when the inert gas is supplied to the process space 209*c*, it may be considered that the insert gas may also enter the process space 209*b*. In this case, there is a possibility that the supply amount of gas to the process space 209*c* side in the plane of the PW disposed in the process space 209*b* may be reduced, and as a result, the process uniformity in the plane of the substrate may not be maintained.

Thus, a method of supplying a process gas to the process space 209 where the DW is disposed may be considered. However, as described above, it may be considered that a particle is generated due to a surplus gas and moved to another process space 209. In order to suppress this, each exhaust system 260 is controlled such that the gas supply amount to the process chamber 201 in which the DW exists is smaller than that of the process chamber in which the PW exists or the exhaust amount of the exhaust system corresponding to the process chamber in which the DW exists is greater than that of other process chambers.

In this manner, when the PW or DW is processed, the gas supply amount or the exhaust amount for each process space 209 is controlled to adjust a balance. Thus, in order to maintain high reproducibility, it is necessary to monitor so that the reproducibility thereof is enhanced.

Therefore, in the present embodiment, the state of each process chamber 201 is detected. The detected process chamber data is displayed on the display device 284 together with the reference data recorded in advance. Thus, it is possible to easily recognize whether the reproducibility has not been obtained in any process chambers. Furthermore, the reference data may be varied depending on the number of PWs or DWs to be processed at a time within the module 200, the required quality, and the like.

Figure 10:
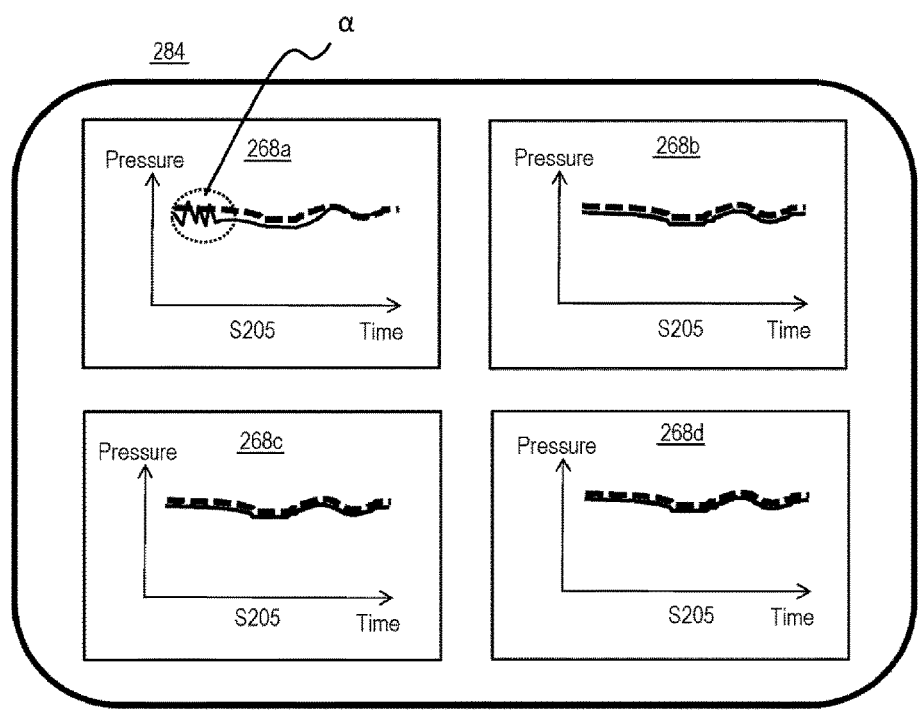
FIG. 10 is an explanatory view illustrating a display screen according to the present embodiment.

Here, an example of the display screen of the display device 284 is illustrated in FIG. 10. In the display screen, the process chamber data of the process chambers 201*a*, 201*b*, 201*c*, and 201*d* at S205 is displayed. In FIG. 10, the state of the process chambers is, for example, pressure data detected by the pressure monitor part 268. In the display, the vertical axis represents pressure, the horizontal axis represents time, the sold line denotes detected data, and the dotted line denotes a reference value. The reference value is, for example, pressure data when an initial set value is executed, or when a film with best quality is formed in the module 200.

Referring to α in FIG. 10, it can be seen that there is a gap in the data in the process chamber 201*a* at S205. That is to say, it can be seen that a problem has occurred in the process chamber 201*a*. When the gap of data is equal to or higher than a threshold, it is determined that a yield of the module 200 degrades. Thereafter, the operation of the apparatus is stopped and maintenance is performed.

However, although the maintenance is performed, it is desirable to easily specify the problem in order to shorten the maintenance time. In FIG. 10, since a data gap occurs in the process chamber 201*a*, an error of setting the supply/exhaust parameter related to the process chamber 201*a* or blockage of the exhaust system 260*a* may be considered. In the present embodiment, since the state of each process chamber 201 can be displayed, which of the process chambers 201 has a problem can be easily specified. For example, when it is not possible to determine in every process chamber 201, the apparatus is required to be stopped once to check every process chamber and check various components related to a respective process chamber to spot the cause of the trouble. This significantly increases the maintenance time. Thus, the productivity may be significantly degraded.

In particular, in this type of apparatus, all the shower heads 230*a* to 230*d*, the process chambers 201*a* to 201*d*, the exhaust systems 260*a* to 260*d*, and the like may be problematic, and specifying a problem among them requires a great deal of care. In contrast, as in the present embodiment, the user can rapidly take measures without taking the time for specifying a problem by displaying the state of the process chamber for each process chamber 201.

In addition, an example of comparing and displaying the pressure data of S205 is illustrated herein, but the present disclosure is not limited thereto and the pressure data may be compared with that at another step or compared with that of the state of another process chamber.

Subsequently, the reference data will be described.

In the foregoing embodiment, the reference data has been described using an initial value as an example, but the present disclosure is not limited thereto. For example, the reference data may be data with best quality among the data related to each module 200, data of another module, or data of another substrate processing apparatus.

In the case where the reference data is data of step S107 of processing a substrate with highest quality, among the data detected by the module 200, if there is a gap, the process is not determined to have high quality. In this case, a high quality semiconductor device can be manufactured with good reproducibility by controlling each component to approximate the reference data. Thus, it is possible to enhance the production yield of the high quality semiconductor device.

In the case where data detected by another module or data detected by another substrate processing apparatus is the reference data, if there is a gap, it is determined that each module has a difference in entity. In this case, by controlling the components to approximate the reference data, the process state of the wafer W can be approximated although there is a difference in entity between the modules or the substrate processing apparatuses. Thus, it is possible to realize the process with high yield.

Figure 11:
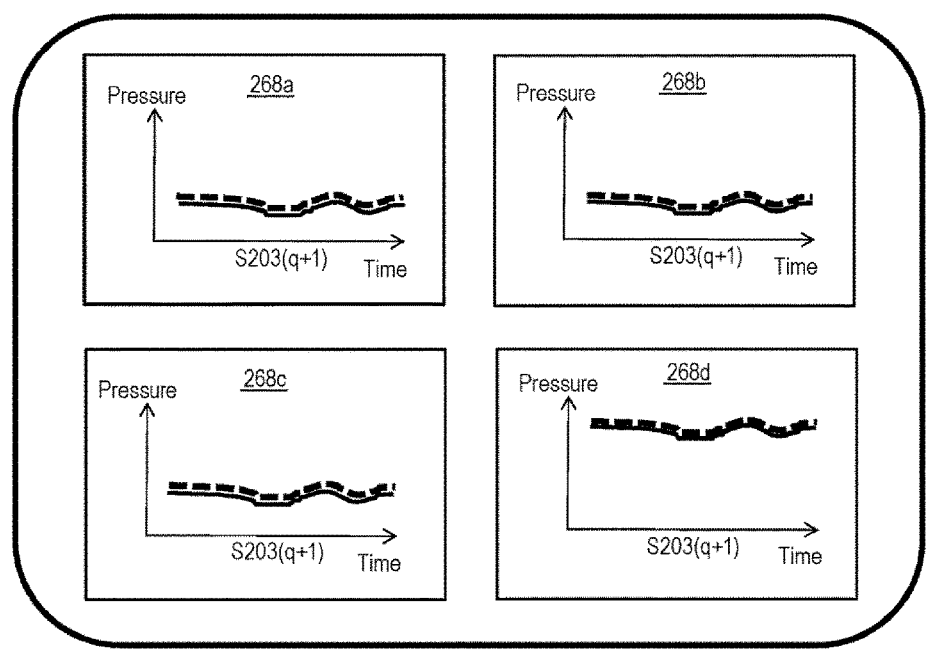
FIG. 11 is an explanatory view illustrating the display screen according to the present embodiment.

As for the reference data, a case where the number of PWs is smaller than the number of the process chambers 201 may be assumed. As an example, there may be a case in which the number of PW is one. This example will be described with reference to FIG. 11. FIG. 11 illustrates a state in which the number of PW is one like S203(q+1) illustrated in FIG. 9. Furthermore, FIG. 9 illustrates an example of using the DW, while FIG. 11 illustrates an example of not using the DW. Here, the pressure is lowered so that the gas is not adhered onto the substrate mounting surfaces 211a, 211b, and 211c of the process chambers 201a, 201b, and 201c. In the process chamber 201d, the pressure is increased so that a film may be formed on the PW. As the reference data, data of "PW exists only in the process chamber 201d and DW does not exist" is read and displayed. In addition, here, the number of PW is one but it may be less than the maximum number of wafers processed in a module. In this case, the reference data for the respective number of sheets may be read.

Figure 12:
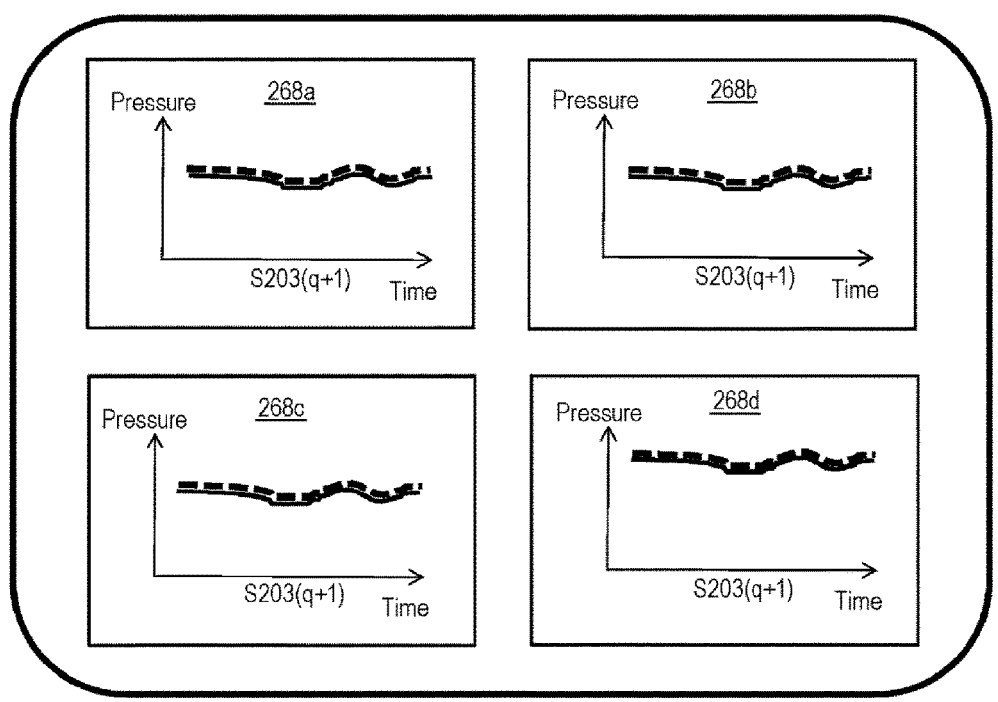
FIG. 12 is an explanatory view illustrating the display screen according to the present embodiment.

Furthermore, regarding the case of FIG. 11, the DW may be used like S203(q+1) of FIG. 9. In this case, data of "PW exists only in the process chamber 201d and DW exists in the process chambers 201a, 201b, and 201c" is read and displayed as the reference data as illustrated in FIG. 12. In the case of FIG. 12, since the DW is used, it is not required to consider the adhesion of the gas onto the substrate mounting surfaces 211a, 211b, and 211c. Thus, the internal pressure of each of the process chambers 201a, 201b, and 201c may approximate that of the process chamber 201d in which the PW exists. By doing so, a pressure difference between the process chambers 201a, 201b, 201c, and 201d is reduced. It is therefore possible to shorten the time for adjusting the overall pressure of the modules, compared with the case of FIG. 11.

Next, a method of applying accumulated data will be described with reference to FIG. 13. The upper table relates to the module 200a and the lower table relates to the module 200b. In each table, the vertical axis represents the number of PWs which can be processed at a time within the module 200. The horizontal axis represents the presence or absence of DW and the presence or absence of a data gap as a result of data comparison. In the presence or absence of DW, θ denotes the presence of DW and ○ denotes the absence of DW. Furthermore, in the presence or absence of a data gap, ◆ denotes a case where there is a gap with the reference data, and ◇ denotes a case in which there is no gap with the reference data. In addition, the presence of a data gap refers to a case where the data gap is equal to or greater than a threshold, and the absence of a data gap refers to a case where the data gap is smaller than the threshold.

By recording the process chamber data in this way, an appropriate module may be employed to be suitable for a case where only one sheet is processed or a case where two sheets are processed. For example, assuming that one sheet is processed, in the mobile 200a, there is a gap in the result of data comparison between both sides of the presence of DW and the absence of DW. On the other hand, in the mobile 200b, there is no gap in the result of comparing data in each of the presence of DW and the absence of DW. That is to say, it can be seen that one sheet is desirably processed better in the module 200b than in the module 200a. Thus, when one sheet is processed, the PW is moved to the module 200b based on that information. For example, the controller 280 may determine whether there is one sheet process based on wafer information of a received lot. When the one sheet process is likely to be performed, the controller 280 controls each component such that a wafer group thereof is moved to and processed in the module 200b.

The tables illustrated in FIG. 13 may be set in each processing process. For example, a plasma generation part may be used in one process, while the plasma generation part may be not used in another process. In this case, there is a possibility that the results of data comparison between the process of using the plasma generation part and the process of not using the plasma generation part are different, and thus, it is desirable that these tables are set in each process.

According to the present disclosure in some embodiments, it is possible to provide a technique capable of easily recognizing a processing state.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   transferring one or more substrates to a module having a first process chamber and a second process chamber;
   reading a recipe program depending on a type and a number of the one or more substrates;
   processing the one or more substrates according to the recipe program;
   detecting a first data indicating a state of the first process chamber during the act of processing the one or more substrates;
   detecting a second data indicating a state of the second process chamber during the act of processing the one or more substrates; and
   displaying the first data with a previously-acquired first reference data for comparison and the second data with a previously-acquired second reference data for comparison, respectively, on a display screen, wherein a first data gap between the first data and the previously-acquired first reference data and a second data gap between the second data and the previously-acquired second reference data indicate a quality of the semiconductor device.

2. The method of claim 1, wherein the type of the one or more substrates is a product substrate, and
   in the act of processing the one or more substrates,
   when a number of product substrates is smaller than a maximum number of substrates processed in the module, a data corresponding to a case where the number of product substrates is smaller than the maximum number of substrates processed in the module is displayed as the previously-acquired first reference data or the previously-acquired second reference data.

3. The method of claim 2, further comprising receiving a wafer information of a lot, wherein a plurality of modules is installed, and
   wherein, among the plurality of modules, a module to which the product substrate is transferred is set based on a result of the comparison between the first data and the previously-acquired first reference data, a result of the comparison between the second data and the previously-acquired second reference data, and the wafer information of the lot.

4. The method of claim 2, wherein each of the first process chamber and the second process chamber includes a heater, and each of the state of the first process chamber and the state of the second process chamber includes a temperature information detected near the heater.

5. The method of claim 2, wherein a plasma generation part is installed in each of the first process chamber and the second process chamber, and each of the state of the first process chamber and the state of the second process chamber includes a generation state of plasma.

6. The method of claim 2, wherein a pressure detection part is installed in each of the first process chamber and the second process chamber, and each of the state of the first process chamber and the state of the second process chamber includes a pressure state of each of the first process chamber and the second process chamber.

7. The method of claim 2, wherein the previously-acquired first reference data or the previously-acquired second reference data is data in processing another substrate.

8. The method of claim 2, wherein the previously-acquired first reference data or the previously-acquired second reference data is data of a substrate processing step in which a quality of the product substrate which has been processed is highest.

9. The method of claim 2, wherein the previously-acquired first reference data or the previously-acquired second reference data is a control value stored in advance.

10. The method of claim 1, wherein the type of the one or more substrates is a product substrate or a dummy substrate,
in the act of transferring the one or more substrates,
when a number of product substrates is smaller than a maximum number of substrates processed in the module, the dummy substrate is prepared so that a total number of product substrates and dummy substrates is equal to the maximum number, and the product substrate and the dummy substrate are loaded into the first process chamber or the second process chamber, and
in the act of processing the one or more substrates,
a data corresponding to the number of the product substrates and the number of the dummy substrates is displayed as the previously-acquired first reference data or the previously-acquired second reference data.

11. The method of claim 10, further comprising receiving a wafer information of a lot,
wherein a plurality of modules is installed, and
wherein, among the plurality of modules, a module to which the product substrate is transferred is set based on a result of the comparison between the first data and the previously-acquired first reference data, a result of the comparison between the second data and the previously-acquired second reference data, and the wafer information of the lot.

12. The method of claim 10, wherein each of the first process chamber and the second process chamber includes a heater, and each of the state of the first process chamber and the state of the second process chamber includes a temperature information detected near the heater.

13. The method of claim 10, wherein a plasma generation part is installed in each of the first process chamber and the second process chamber, and each of the state of the first process chamber and the state of the second process chamber includes a generation state of plasma.

14. The method of claim 10, wherein a pressure detection part is installed in each of the first process chamber and the second process chamber, and each of the state of the first process chamber and the state of the second process chamber includes a pressure state of each of the first process chamber and the second process chamber.

15. The method of claim 10, wherein the previously-acquired first reference data or the previously-acquired second reference data is data in processing another substrate.

16. The method of claim 10, wherein the previously-acquired first reference data or the previously-acquired second reference data is data of a substrate processing step in which a quality of the product substrate which has been processed is highest.

17. The method of claim 10, wherein the previously-acquired first reference data or the previously-acquired second reference data is a control value stored in advance.

18. The method of claim 1, further comprising receiving a wafer information of a lot, wherein a plurality of modules is installed, and
wherein a module to which a product substrate is transferred is set based on a result of the comparison between the first data and the previously-acquired first reference data, a result of the comparison between the second data and the previously-acquired second reference data, and the wafer information of the lot.

* * * * *